(12) United States Patent  (10) Patent No.: US 9,099,993 B2
Thomas et al.  (45) Date of Patent: *Aug. 4, 2015

(54) CIRCUIT FOR REVERSE BIASING INVERTERS FOR REDUCING THE POWER CONSUMPTION OF AN SRAM MEMORY

(71) Applicant: COMMISSARIAT A L'ENERGIE ATOMIQUE ET AUX ENERGIES ALTERNATIVES, Paris (FR)

(72) Inventors: Olivier Thomas, Revel (FR); Adam Makosiej, Paris (FR); Andrei Vladimirescu, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/356,562

(22) PCT Filed: Oct. 18, 2012

(86) PCT No.: PCT/EP2012/070666
§ 371 (c)(1),
(2) Date: May 6, 2014

(87) PCT Pub. No.: WO2013/068221
PCT Pub. Date: May 16, 2013

(65) Prior Publication Data
US 2014/0334226 A1  Nov. 13, 2014

(30) Foreign Application Priority Data

Nov. 7, 2011  (FR) .................................... 11 60085

(51) Int. Cl.
*G11C 5/14*  (2006.01)
*G11C 11/4074*  (2006.01)
*G11C 16/30*  (2006.01)
*H03K 3/012*  (2006.01)
(Continued)

(52) U.S. Cl.
CPC ............... *H03K 3/012* (2013.01); *G11C 5/146* (2013.01); *G11C 11/4074* (2013.01);
(Continued)

(58) Field of Classification Search
CPC ...... G11C 5/147; G11C 13/0038; G11C 5/14; G11C 11/4074; G11C 2207/2227
USPC ............... 365/154, 155, 156, 189.08, 189.09, 365/226, 229, 233.15
See application file for complete search history.

(56) References Cited

U.S. PATENT DOCUMENTS 5,874,851 A  2/1999  Shiota
2003/0080802 A1  5/2003  Ono et al.

FOREIGN PATENT DOCUMENTS

EP  1684299 A1  7/2006

*Primary Examiner* — Ly D Pham
(74) *Attorney, Agent, or Firm* — Baker & Hostetler LLP

(57) ABSTRACT

CMOS integrated circuits with very low consumption when idle, and notably the SRAM volatile memories, are provided. The inverters of the circuit are made up of an NMOS transistor and a PMOS transistor. A bias circuit applies a first rear bias voltage NBIAS to the wells of the NMOS transistors and a second rear bias voltage PBIAS to the wells of the PMOS transistors. The bias circuit comprises: a detection array made up of many inverters in parallel, having a common output supplying a logic signal whose value depends on the rear bias voltages applied to the array, a circuit for producing incrementation or decrementation pulses, controlled by the output of the detection array, and an integration circuit linked to the pulse-producing circuit, for producing and varying, progressively by increments in response to these pulses, a bias voltage PBIAS and a bias voltage NBIAS.

16 Claims, 5 Drawing Sheets

(51) Int. Cl.
*G11C 11/412* (2006.01)
*G11C 11/417* (2006.01)
*G11C 11/41* (2006.01)
*G11C 13/00* (2006.01)

(52) U.S. Cl.
CPC ............. *G11C 11/41* (2013.01); *G11C 11/412* (2013.01); *G11C 11/417* (2013.01); *G11C 5/14* (2013.01); *G11C 5/147* (2013.01); *G11C 13/0038* (2013.01); *G11C 2207/2227* (2013.01)

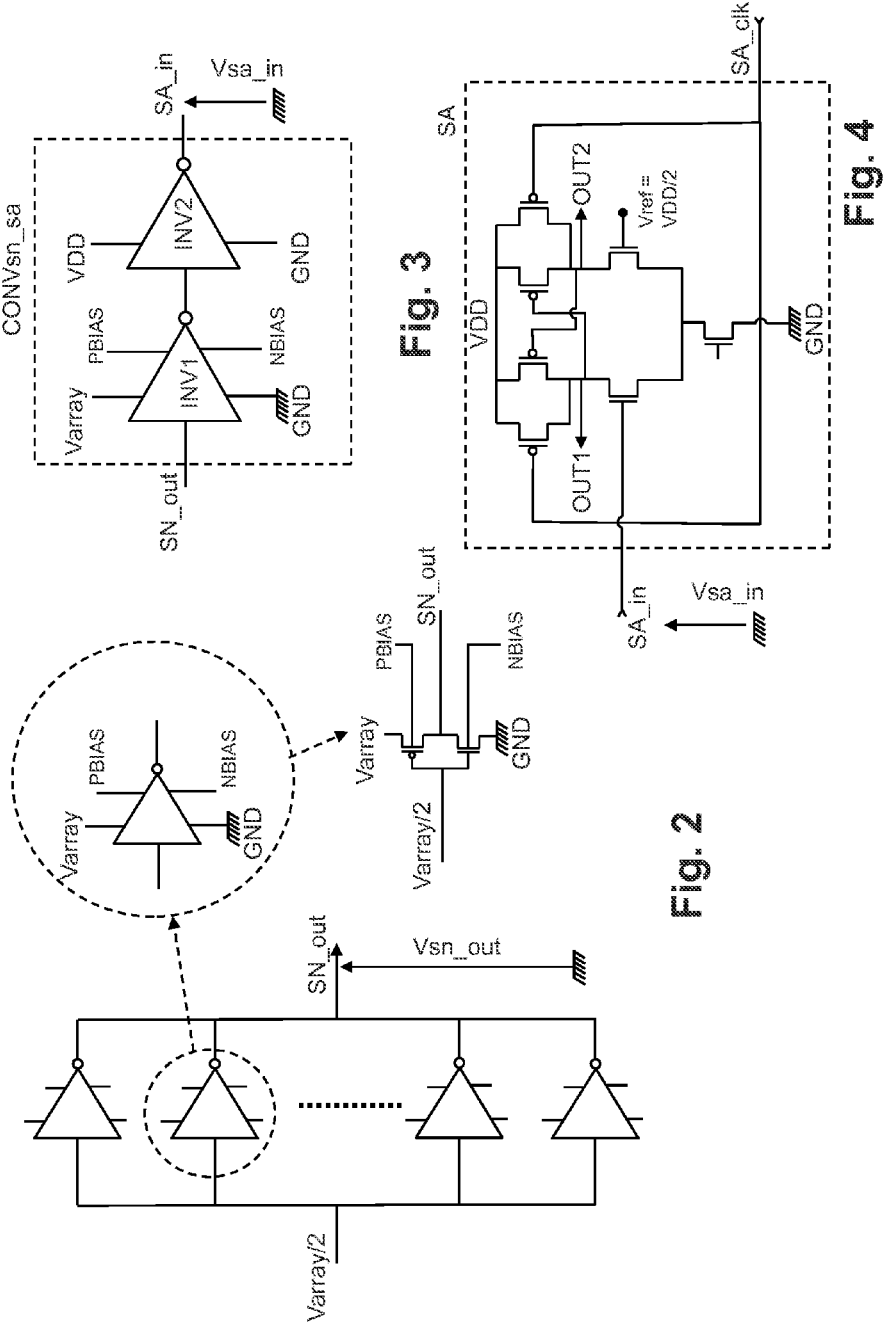

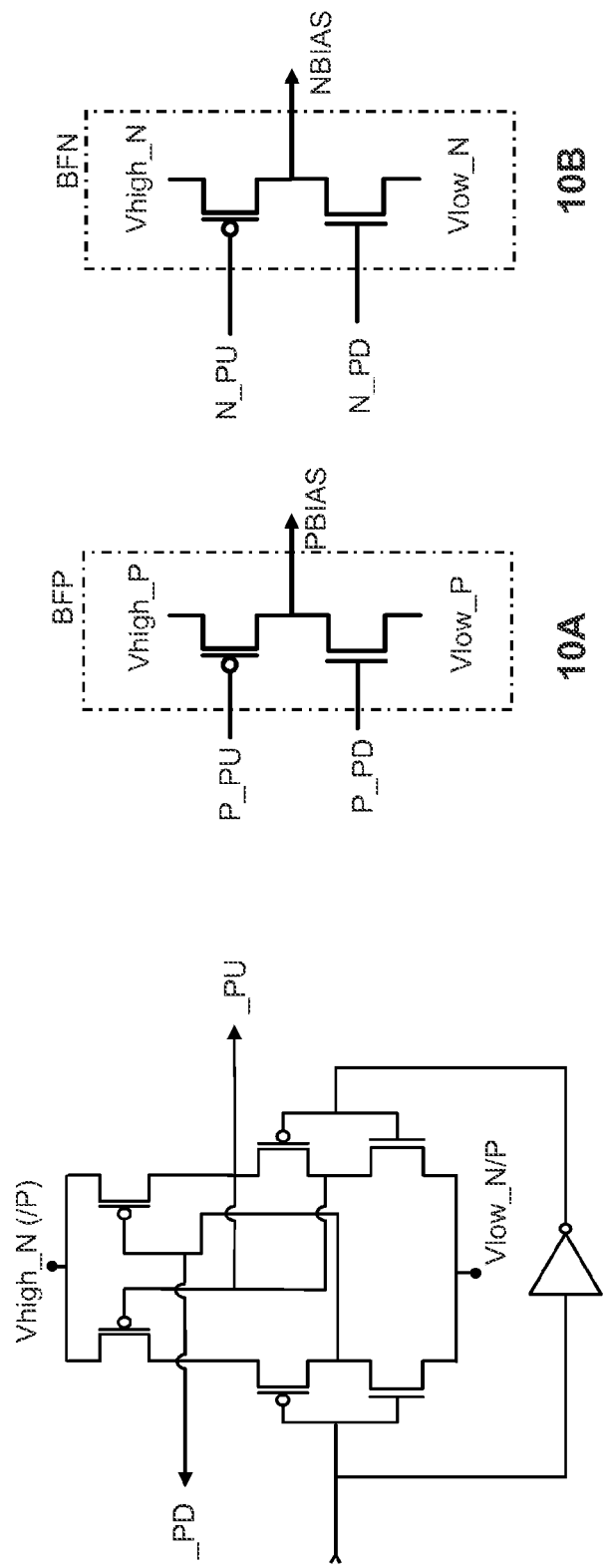

CIRCUIT FOR REVERSE BIASING INVERTERS FOR REDUCING THE POWER CONSUMPTION OF AN SRAM MEMORY

CROSS-REFERENCE TO RELATED APPLICATIONS

This application is a National Stage of International patent application PCT/EP2012/070666, filed on Oct. 18, 2012, which claims priority to foreign French patent application No. FR 1160085, filed on Nov. 7, 2011, the disclosures of which are incorporated by reference in their entirety.

FIELD OF THE INVENTION

The invention relates to very low consumption CMOS integrated circuits, and notably SRAM volatile memories.

BACKGROUND

Increasingly complex integrated circuits are being used in applications where the availability of energy is very limited. Such is the case with mobile phones, handheld computers, and other battery-powered electronic appliances. It is important to minimize their consumption by all possible means in order to have sufficient operating autonomy. Now, the integrated circuits consume all the more power when they include a larger number of transistors, and integrated circuits are now being made which include hundreds of millions, even billions of transistors. Volatile memories of SRAM type are in particular used in these appliances, and their capacity can run to millions or billions of memory points, each memory point having, for example, six transistors.

The SRAM solid-state memories need to be supplied with energy even when not being used, to be able to retain their content between uses. If the power supply is cut, the stored information disappears. Since the periods of non-use can sometimes be much longer than the periods of use, attention has to be paid most specifically to minimizing the consumption during the periods of non-use.

Generally, it is common practice to reduce the power supply voltage for the integrated circuits, and notably for the SRAM memories in a standby mode between uses; the normal voltage is then restored, allowing for active operation of the memory in read or write mode when the appliance is to be used again. However, it is still necessary to retain a sufficient power supply voltage in standby mode to guarantee that the information stored in memory is maintained. The limit of this method therefore lies in the choice of a standby voltage that is well suited, both low enough to limit the consumption and sufficient to guarantee that the stored information is maintained.

It has also been proposed to modify the rear face bias voltages of the integrated circuit substrate according to the more or less active use of the appliance: normal mode, standby mode, or even accelerated operating mode.

The patent publication US-2003-080802 moreover describes a circuit for adjusting well bias in normal operation, intended first of all to optimize the speed, and secondarily the current leakages at rest, which can deteriorate if the well bias voltage is ill-matched. This document uses an inverter as detector, this inverter having its output looped back to its input, and this inverter receives specific bias voltages enabling it to operate as detector. The circuit described in this publication does not allow for adaptation of the bias voltages when switching to a very low power supply voltage in standby mode; it works for a standard power supply voltage.

SUMMARY OF THE INVENTION

The present invention aims to improve the possibilities for reducing the consumption in standby mode by an adaptive action on the rear bias voltage of the wells of the NMOS and PMOS transistors which make up the inverters used in the circuit.

The invention therefore applies to integrated circuits whose NMOS transistors, formed in or above P-type doped wells, and the PMOS transistors, formed in or above N-type doped wells, receive distinct rear bias voltages NBIAS and PBIAS. A bias circuit establishes these bias voltages notably on the inverters with two transistors of an SRAM memory, from a detection array which comprises many NMOS and PMOS transistors; the average behaviour of these transistors varies according to the bias voltages, because of the fact that these voltages tend to modify the transistor switch-on threshold voltages; the bias voltages are acted upon in such a way as to approximate a desired optimal behaviour. The optimal behaviour is preferably a behaviour in which the NMOS and PMOS transistors are balanced. The expression "balanced transistors" should be understood to mean the fact that one and the same reference voltage, preferably equal to half the power supply voltage Varray of the inverters which are to be biased, applied to the gate of an NMOS transistor and applied to the gate of a PMOS transistor, tends to cause identical currents to flow in both transistors.

Consequently, the invention proposes a bias circuit for the inverters of an integrated circuit, each inverter comprising an NMOS transistor and PMOS transistor powered by a power supply voltage Varray, with means for applying a first rear bias voltage NBIAS to the wells of the NMOS transistors and a second rear bias voltage PBIAS to the wells of the PMOS transistors, the bias circuit according to the invention supplying these bias voltages and comprising:

a detection array comprising a set of many inverters mounted in parallel, the inverters being biased by the two bias voltages and receiving on their gates one and the same reference voltage between 0 and a power supply voltage Varray of the inverters, the common output of the inverters forming the output of the detection array, this output providing a logic signal whose value depends on the rear bias voltages applied to the array, a circuit for producing incrementation or decrementation pulses, controlled according to the output voltage of the detection array, and an integration circuit linked to the pulse-producing circuit, to produce and vary, progressively by increments in response to these pulses, a bias voltage PBIAS and a bias voltage NBIAS in a direction tending to invert the level of the output logic signal of the detector array.

The reference voltage applied to the input of the inverters of the detection array is preferably Varray/2.

A logic level translation circuit can be interposed between the output of the detection array and the input of the pulse-producing circuit.

The pulse-producing circuit may comprise a detection amplifier and a control circuit, the control circuit comprising a clock circuit periodically producing an activation signal made up of brief pulses used to activate the detection amplifier, the detection amplifier receiving a voltage from the detection array and acting as a comparator relative to a reference voltage to produce, on one of two outputs (OUT1, OUT2), according to the result of the comparison, a control pulse.

The control circuit receives the two outputs of the detection amplifier and it produces four corresponding pulsed signals according to the results of the comparison; these signals constitute incrementation and decrementation pulses for the voltages NBIAS and PBIAS respectively; these pulses are transmitted respectively to four level translator circuits, two first level translator circuits converting two of the pulsed signals into a voltage band corresponding to a voltage variation band desired for the bias voltage PBIAS, and two other level translator circuits converting the other two pulsed signals into a voltage band corresponding to a voltage variation band desired for the bias voltage NBIAS.

The integration circuit preferably comprises a first circuit for producing the bias voltage PBIAS and a second circuit for producing the bias voltage NBIAS, the first circuit receiving on its inputs the outputs of two first level translator circuits, and the second circuit receiving on its inputs the outputs of the other two level translator circuits.

The first circuit and the second circuit can be produced very simply from two series transistors, a PMOS transistor and an NMOS transistor, which receive on their gates the outputs of the level translator circuits. For the first circuit, the set of two series transistors is powered between a low voltage (Vlow_P) and a high voltage (Vhigh_P) corresponding to the voltage band desired for the variation of the voltage PBIAS. For the second circuit, the set of series transistors of the second circuit being powered between a low voltage (Vlow_N) and a high voltage (Vhigh_N) corresponding to the voltage band desired for the variation of the voltage NBIAS. In the two circuits, the bias voltage (PBIAS or NBIAS) is supplied at the junction point of the NMOS transistor and of the PMOS transistor.

Generally (but not mandatorily), the bias circuit will include an enable input which enables or disables the application of incrementation or decrementation pulses to the integration circuit, and it will be used notably to enable this application in standby mode with reduced voltage power supply for the integrated circuit (notably the SRAM memory).

BRIEF DESCRIPTION OF THE DRAWINGS

Other features and advantages of the invention will become apparent from reading the following detailed description which is given in reference to the appended drawings in which:

FIG. 2 represents the construction of the detection array consisting of multiple inverters in parallel;

FIG. 3 represents a logic level conversion stage (optional) at the output of the detection array;

FIG. 4 represents the construction of the detection amplifier;

FIG. 9 represents a variant level translator circuit;

FIG. 10 represents the integration circuit which produces the voltages PBIAS and NBIAS from the received incrementation or decrementation pulses.

DETAILED DESCRIPTION

Figure 1:
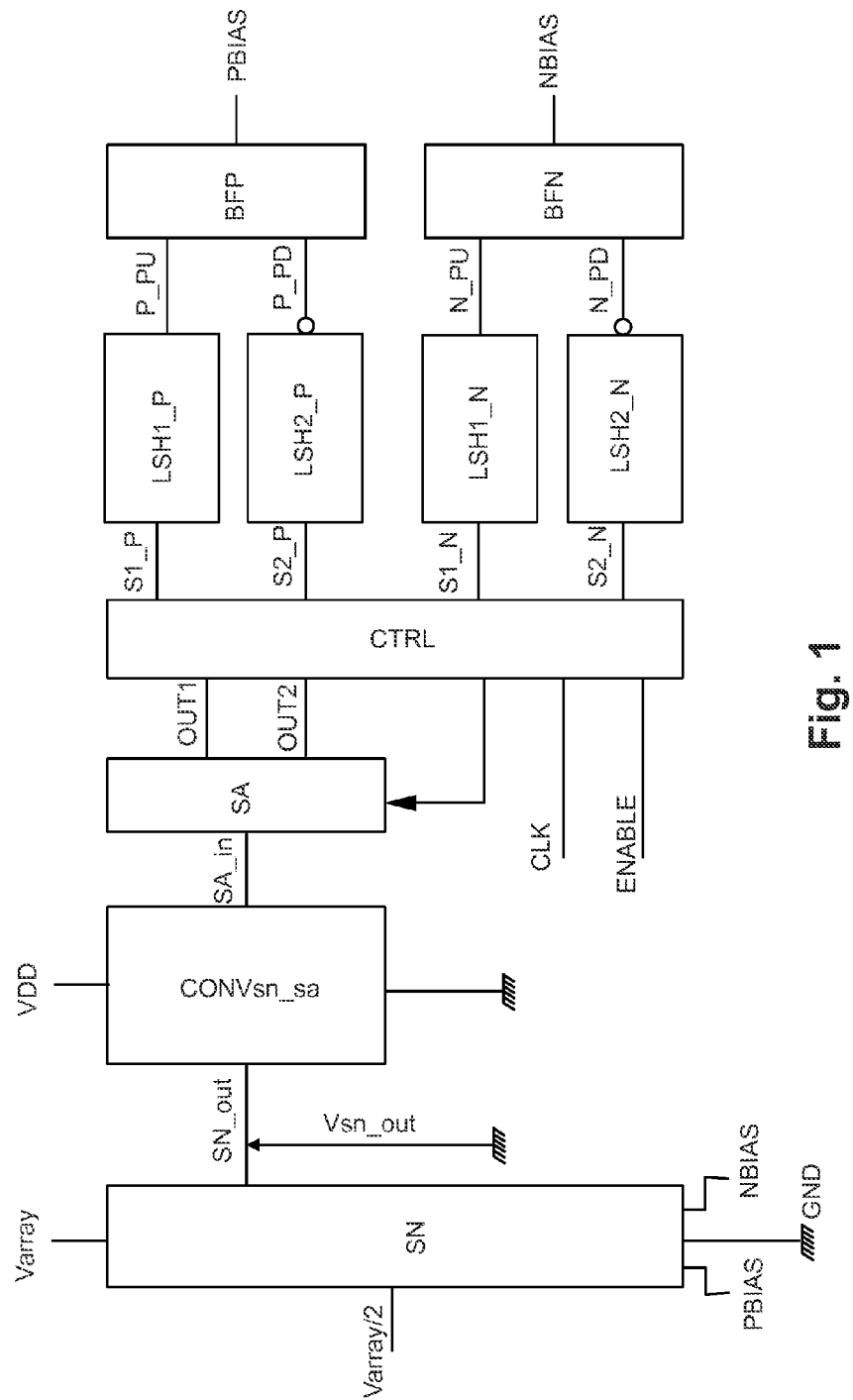
FIG. 1 represents the general architecture of the bias circuit according to the invention.

The diagram of FIG. 1 represents the bias circuit according to the invention which is associated, for example, with an SRAM memory which is not represented in the figure and comprising a matrix of binary storage elements, each storage element comprising at least two inverters, and each inverter comprising a PMOS transistor in series with an NMOS transistor.

The bias circuit comprises a detection array SN comprising multiple parallel inverters; these inverters are identical to those of the SRAM memory; they therefore behave like those of the memory with respect to their response to bias voltage changes. This detection array supplies, on its output SN_out, a voltage value Vsn_out which represents the difference between the respective resistances of the NMOS and PMOS transistors in the inverters, that is to say, the difference between the abilities of these transistors to draw current when their gate receives an intermediate voltage between a blocking voltage and a switch-on voltage. By using multiple inverters (at least twenty and preferably a hundred or more), this array gives an indication of the average force difference between the PMOS and NMOS transistors; for statistical reasons, this average difference represents that of the inverters of the memory with which this detection array is associated. This average force difference depends on the rear bias voltages applied to the wells in which the transistors are constructed, because these rear bias voltages act directly on the threshold voltages of the transistors. The rear bias voltages NBIAS and PBIAS which are applied to the transistors of the inverters of the memory are also applied to the inverters of the detection array SN in order for the detection array to faithfully represent the behaviour of the inverters of the memory. Similarly, the inverters of the detection array are powered by the same general power supply voltage Varray which powers the memory points of the SRAM memory.

It is assumed hereinbelow that the power supply is formed between a voltage Varray and a ground GND referenced to 0 volt.

Hereinafter, the focus will be mainly on the case where the memory operating in standby mode, and the voltage Varray is the reduced power supply voltage (compared to the power supply voltage in normal operating mode) applied to the array of memory points, allowing for the consumption to be minimized while ensuring permanence for the stored information. The bias circuit according to the invention will make it possible to act on rear bias voltages NBIAS and PBIAS of the memory in order to both minimize the consumption and guarantee a sufficient stability of the stored information.

The inverters conventionally consist of an NMOS transistor having its source grounded, in series with a PMOS transistor having its source connected to Varray. The gates of the two transistors are common and constitute the input of the inverter; the drains are common and constitute the output. The PMOS transistor is formed in an N-type well to which a rear bias voltage PBIAS is applied; the NMOS transistor is formed in another, P-type, well, to which a rear bias voltage NBIAS is applied.

A common voltage, intermediate between 0 and Varray is applied to the input of all the inverters of the detection array, to the common gates of the NMOS and PMOS transistors which make up this array, said common voltage being used to evaluate the respective forces of the NMOS and PMOS transistors. Preferably, this reference voltage is Varray/2. The inverters receiving this intermediate voltage on their gates have a tendency to toggle in one direction or in the other direction depending on the respective force of the NMOS transistor and of the PMOS transistor. Overall, the output voltage of the array of multiple parallel inverters tends to take a value Vsn_out which devolves from this difference between the forces of the NMOS and PMOS transistors: Vsn_out takes a lower value (and even a value close to 0) if the NMOS transistors are, on average, higher; Vsn_out takes a higher value (and even a value close to Varray) if the PMOS transistors are, on average, higher. Even if the values of Vsn_out are not exactly 0 and Varray, it is assumed that Vsn_out is a low level or high level logic signal depending on whether Vsn_out is greater than or less than Varray/2.

The output of the detection array SN is preferentially applied to a level translator circuit CONVsn_sa which converts the level of the voltage Vsn_out, which is in the voltage range from 0 to Varray, into a logic level in a range from 0 to VDD, in which VDD is the general power supply voltage of the integrated circuit. The function of this translator circuit is to supply an output logic signal SA_in which is equal to zero or equal to VDD depending on whether the NMOS transistors are, on average, higher or lower than the PMOS transistors. We will return later to this translator circuit CONVsn_sa which may consist of a simple threshold comparator whose threshold would be set between 0 and Varray (preferably Varray/2), or which may even be eliminated if the comparison with this threshold is performed directly in the ensuing amplifier stage.

The output SA_in of this level translator circuit is connected to a detection amplifier SA, the function of which is to compare the value of the signal SA_in to a reference voltage VDD/2 at the moment of a periodic activation signal SA_clk as follows: the amplifier SA has two outputs OUT1 and OUT2; for an inactive state of the activation signal SA_clk, the two outputs are pre-charged to one and the same level; for an active state of the activation signal, only one of the outputs will change to zero, depending on the level of the input signal SA_in. In the case where no level translator stage CONVsn_sa is provided, the reference voltage of the amplifier SA is Varray/2 rather than VDD/2.

The activation pulses SA_clk are very brief, and, consequently, the pulses on the output OUT1 or OUT2 are very brief. Their brevity makes it possible, as will be seen, to periodically adjust the bias voltages PBIAS and NBIAS by tiny increments or decrements in order to guarantee the stability of the bias. Preferably, the pulses are at least ten times shorter than the period at which they are sent.

The detection amplifier therefore supplies, on each cycle at the period of the clock CLK, a pulse on the output OUT1 or on the output OUT2, depending on the result of the comparison. A pulse on the output OUT1 will cause the voltages NBIAS and PBIAS to be incremented. A pulse on the output OUT2 will cause these voltages to be decremented.

The outputs OUT1 and OUT2 of the amplifier SA are applied to a control circuit CTRL which also receives an enable signal ENABLE and a clock signal CLK. The control circuit has two functions: firstly, it establishes the activation signal SA_clk periodically with a period given by the clock CLK; then, it establishes four logic signals S1_P, S1_N, S2_P, S2_N intended for level translator circuits; the two logic signals S1_P and S1_N correspond to the logic level OUT1 but are slightly delayed relative to OUT1; these are brief pulses, sent if the detection amplifier SA has supplied a pulse on OUT1. Similarly, the two logic signals S2_P and S2_N correspond to the logic level OUT2 but are slightly delayed relative to OUT2; these are brief pulses sent only if the detection amplifier has sent a pulse on OUT2. It will be seen later that the signals S1_N and S2_P can be disabled in the absence of enabling by an ENABLE signal. The ENABLE signal is supplied, for example, at the same time as a command to switch the integrated circuit to standby mode.

The pulses S1_P will be used to increment the bias voltage PBIAS and at the same time the pulses S1_N will be used to increment the bias NBIAS. The pulses S2_P will be used to decrement the bias PBIAS and at the same time the pulses S2_N will be used to decrement the bias NBIAS.

The logic signals S1_P, S1_N, S2_P, S2_N at the output of the control circuit are within the band 0 to VDD. They are transmitted respectively to each of four level translator circuits LSH1_P, LSH1_N, LSH2_P, LSH2_N which have the following functions: they shift the output level of the signals S1_P, S1_N, S2_P, S2_N from the band 0-VDD to the voltage bands assigned to the rear bias voltages PBIAS and NBIAS. For example, the bias voltage PBIAS has to be able to vary between Varray and Varray+0.9 volt and the bias voltage NBIAS has to be able to vary between 0 and −0.9 volt. For example, if Varray is equal to 0.2 volt, it is possible to envisage PBIAS varying between 0.9 volt and 1.1 volt.

Thus, the level translators LSH1_P and LSH2_P supply incrementation P_PU and decrementation P_PD pulsed logic signals for the production of the voltage PBIAS; similarly, the level translators LSH1_N and LSH2_N supply incrementation and decrementation pulsed logic signals N_PU and N_PD for the production of the voltage NBIAS.

The signals P_PU and P_PD vary between a voltage Vlow_P and a voltage Vhigh_P, which are, for example, respectively Varray and Varray+0.9 volt. The signals N_PU and N_PD vary between a voltage Vlow_N and a voltage Vhigh_N which are, for example, respectively −0.9 volt and 0 volt.

These duly translated pulsed logic signals are applied to output circuits BFP and BFN which supply the bias voltages PBIAS and NBIAS. These output circuits are integrator circuits which integrate the small incrementation or decrementation variations imposed by the pulses which are applied to them. The pulses P_PU act to increment the voltage PBIAS; the pulses P_PD act to decrement it. Similarly, the signals N_PU and N_PD act on the voltage NBIAS, one to increment it and the other to decrement it. The increments and decrements are low to ensure a stability on the bias voltages.

Because of this, a slaving of the voltages PBIAS and NBIAS occurs: a progressive variation of the bias voltages following pulses in one direction will progressively increase the threshold voltage of one of the NMOS or PMOS transistors of the pair forming an inverter and reduce that of the other. When this variation is sufficient, the signal Vsn_out will finish by toggling to a state other than the logic state that it had previously. This modification will invert the pulsed control signals: if the pulses were coming from the output OUT1, they will now switch to the output OUT2 where they act in the opposite direction (decrementation instead of incrementation, or otherwise).

There now follows a detailed description of the circuits which make up the diagram of FIG. 1. Hereinafter, explanations will be given with the assumption that the circuit to be biased is an SRAM memory and that this memory is set to standby mode by the application of a low power supply voltage Varray, lower than the normal power supply voltage VDD of the memory, but which must, however, be sufficient to maintain the stored information, that is to say, to keep the inverters in the state that they were in before the switch to standby mode. However, it will be noted that the invention also makes it possible to manage the bias of the inverters in normal mode and not only in standby mode, notably to allow for writing to be accelerated.

FIG. 2 represents the principle of the detector array SN: it comprises many parallel inverters, with all their inputs combined as one common input and all their outputs combined as one common output SN_out. The inverters are all identical, and identical to the inverters of the SRAM memory that the bias circuit is intended to bias. The inverters of the detection array are all biased by the bias circuit itself of which this array forms part; they are therefore biased in the same way as the other inverters of the integrated circuit. The bias comprises the application of four potentials: the reference potential 0 of the ground GND (the reference 0 is an arbitrary reference) applied to the sources of the NMOS transistors, the potential Varray applied to the sources of the PMOS transistors, the bias voltage NBIAS applied to the P-type wells above which or in which the NMOS transistors are formed, and the voltage PBIAS applied to the N-type wells above which or in which the PMOS transistors are formed. It will be recalled that these bias voltages influence the threshold voltages of the transistors. They therefore influence the respective conductances of the NMOS transistor and of the PMOS transistor in an inverter, and therefore the risks of untimely toggling of the inverter when the integrated circuit is set to standby mode at reduced power supply voltage Varray. This is why it is important to give these bias voltages values that allow for the forces of the two transistors of the inverter to be balanced. This balance is considered to be achieved when the inverters of the array SN are in a situation close to toggling, that is to say that a small modification of the voltages NBIAS or PBIAS will be sufficient to toggle Vsn_out to zero if Vsn_out was close to Varray or to Varray if Vsn_out was close to zero.

It will be noted that the invention is applicable either to technologies in which the transistors are formed directly in individual diffused P-type wells (NMOS transistors) or N-type wells (PMOS transistors), or to technologies in which the transistors are each formed above an individual well but separated from this well by other layers. In all cases, the important thing is that the bias voltage of the well influences the threshold voltage of the transistor.

The number of inverters of the detection array is dictated by statistical considerations: it has to be sufficient to correctly represent the average behaviour of the inverters of the integrated circuit to be biased. A number of hundred will generally be sufficient. In an SRAM memory with several hundred rows and columns, it will be possible to use, for example, to form the detection array, the inverters of a dummy column of memory points, these inverters therefore being identical to the inverters of the true memory points but connected differently.

FIG. 3 represents the level translator circuit CONVsn_sa which, it will be recalled, is optional. It converts the voltage range of 0 to Varray from the array SN to a range of 0 to VDD, in which VDD is the general power supply voltage of the integrated circuit.

It preferably comprises, firstly, a first inverter INV1 biased like the others by the rear bias voltages PBIAS and NBIAS, and powered between 0 and Varray. This inverter receives the voltage Vsn_out; it preferably consists of transistors that are larger than the tiny transistors of the SRAM memory. This makes them less sensitive to the fabrication dispersions conventionally undergone by the small transistors. The geometry in terms of ratio width W to length L of the transistor is, however, the same as that of the transistors of the inverters of the memory. At the output of this inverter INV1, the voltage is unequivocally 0 or unequivocally Varray even if the voltage Vsn_out has a value which is not exactly one of these two values.

The output of the inverter INV1 is linked to the input of a second inverter INV2 which is powered between 0 and VDD and whose NMOS transistor is intrinsically much stronger than the PMOS transistor independently of the rear bias voltages applied: the NMOS transistor has a high ratio W/L, and the PMOS transistor has a low ratio W/L. The aim is to have a toggle point for the inverter for an input voltage less than Varray, in order for the output of this inverter to correctly represent, but now in the voltage range 0-VDD, the state of the input of the first inverter.

FIG. 4 represents an exemplary embodiment of the detection amplifier SA, powered between 0 and VDD. Its input SA_in receives the output voltage Vsa_in of the circuit of FIG. 3. It also receives a reference voltage Vref and a periodic activation input SA_clk, and it has two outputs OUT1 and OUT2. The reference voltage is preferably VDD/2; however, if the stage of FIG. 3 were absent, this reference voltage would then be Varray/2 (the amplifier then being powered between 0 and Varray).

The amplifier compares the input Vsa_in to the reference voltage Vref at moments determined by the periodic activation signal SA_clk. The activation signal SA_clk is a periodic signal which in turn depends on the outputs of the amplifier; it consists of a very brief periodic pulse during which the comparison is made.

If the activation signal SA_clk is at the low level (inactive), the outputs OUT1 and OUT2 are both at the same level, here, a high level VDD.

If the activation signal is at the high level (active), one of the outputs changes state, but not the other. The output which changes state depends on the results of the comparison between Vsa_in and Vref.

The outputs are therefore identical when the clock is at the low level and complementary when it is at the high level. In the configuration represented in FIG. 4, the output OUT1 changes to the low level when the voltage Vsa_in is greater than Vref, therefore when the output voltage Vsn_out of the detection array is close to Varray; conversely, the output OUT2 changes to the low level when Vsn_out is close to zero.

Figure 5:
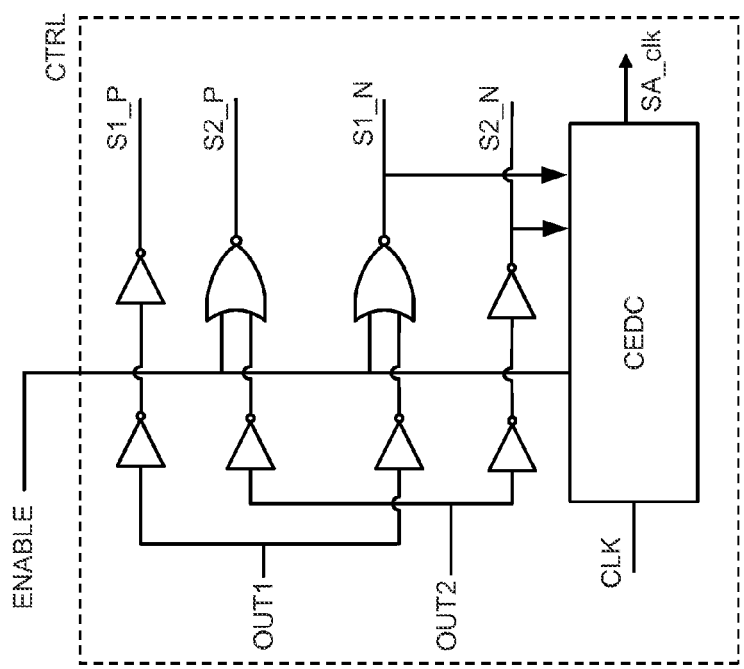
FIG. 5 represents the control circuit which generates four complementary pulsed signals and which also generates brief activation pulses intended for the detection amplifier.

FIG. 5 represents the control circuit CTRL. This circuit receives a periodic clock signal CLK, an enable signal ENABLE, and the logic signals of the outputs OUT1 and OUT2 of the detection amplifier.

The ENABLE signal may originate, for example, from a command to switch to standby mode.

The control circuit comprises logic gates which process the signals OUT1 and OUT2 in a way that will be indicated, and a clock transition detection circuit CEDC which produces the pulsed activation signal SA_clk from the periodic clock signal CLK and from the signals OUT1 and OUT2.

In addition to the activation signal SA_clk, the control circuit produces four output signals:
S1_N and S2_N which will be used to produce the bias voltage NBIAS, one of them being used to increment this voltage, the other being used to decrement it;
and S1_P and S2_P which will be used to produce the bias voltage PBIAS, one to increment it and the other to decrement it.

The ENABLE signal is active at the low level. It enables the outputs S1_N and S2_P respectively to supply logic values present on OUT1 and OUT2. At the high level, the ENABLE signal forces the signals S1_N and S2_P to zero, the consequence being that the bias circuit no longer ensures its NBIAS and PBIAS regulation function but forces NBIAS and PBIAS to nominal values which are preferably zero for NBIAS and Varray for PBIAS.

The description below focuses on what happens when the ENABLE signal is active.

The zero-transition pulses of OUT1 are referred to the outputs S1_N and S1_P; the pulses OUT2 are referred to the outputs S2_N and S2_P.

The signals on the outputs S1_N and S2_N (this could also be S2_N and S2_P) are used to control the clock transition detection circuit CEDC. This circuit periodically generates a very brief pulse SA_clk during which the comparison is made in the detection amplifier.

The CEDC circuit receives for this purpose the periodic clock CLK whose high and low levels are of identical duration. It also receives the ENABLE signal and here again the case where ENABLE is active (standby mode), therefore at the low level, is considered. If ENABLE were at the inactive level (high level), the circuit would not produce pulses SA_clk.

Figure 6:
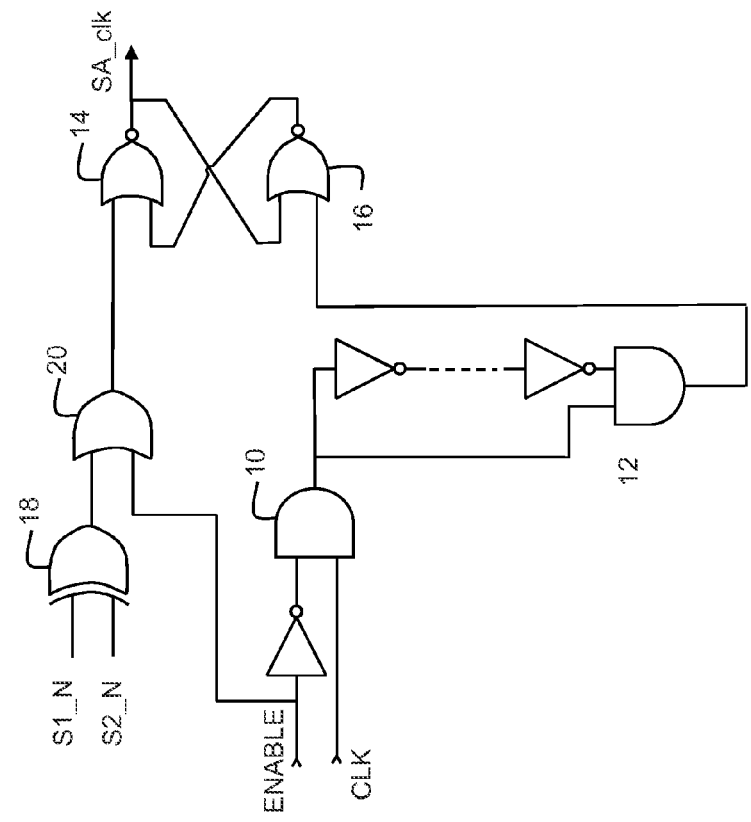
FIG. 6 represents the circuit which produces the brief activation pulses.

The clock transition detection circuit is represented in FIG. 6. An AND gate 10 transmits the clock CLK and its complement delayed by one or more series inverters to the inputs of another AND gate 12 so as to produce a brief triggering pulse on the rising edge of the clock signal; this pulse, applied to a first input of an RS flip-flop (consisting of two NI gates 14 and 16 looped one onto the other), toggles the flip-flop, causing the output signal SA_clk, initially at the low level, to switch to the high level.

The comparison process is then carried out in the detection amplifier during this brief pulse. One of the signals OUT1 or OUT2 will therefore switch to zero during this pulse. The signals S1_N and S2_N (corresponding to the signals OUT1 and OUT2 but slightly delayed) are applied to the inputs of an exclusive-OR gate 18 which supplies a generally zero logic signal when S1_N and S2_N are both at the 1 level and which supplies a high logic signal when one or other of OUT1 and OUT2 changes to zero.

The transition to the high level of the output of the gate 18 once again toggles the flip-flop 14, 16 which returns the signal SA_clk to zero, interrupting the activation signal which is therefore very brief. The signal OUT1 or OUT2 which was switched to the low level reverts to the high level that is imposed on it by the interruption of the activation signal; the signals S1_N, S1_P, S2_N, S2_P all return once again to the high level.

The result is that there is, periodically, a brief pulse either on the output S1_N and the output S1_P or on the output S2_N and the output S2_P, depending on whether the bias voltages PBIAS and NBIAS have to be incremented or decremented.

An OR gate 20 receives the ENABLE signal to block the flip-flop with SA_clk at the low level when ENABLE is at the inactive level (high level) to prevent the slaving of the bias voltages.

The pulse is used, in the manner of a charge pump, to increment or decrement the average voltage PBIAS or NBIAS by injecting a brief charging or discharging current for the duration of the pulse. It is the overall natural capacitance of the regions biased by the voltages PBIAS and NBIAS which maintains the bias voltage at an average value between two pulses.

However, the signals S1_N, S1_P, S2_N, S2_P are between 0 (low level) and VDD (high level). They have to be returned to a voltage band corresponding to the voltage band within which the voltages NBIAS and PBIAS can range.

For example, the voltage Varray is 0.2 volt and the objective is to have the rear bias voltages able to vary between 0 volt and −0.9 volt for NBIAS and between 0.2 volt and 1.1 volt for PBIAS.

This is the reason for the presence of the level translators LSH1_P, LSH2_P, LSH1_N, LSH2_N in FIG. 1.

Figures 7, 8:
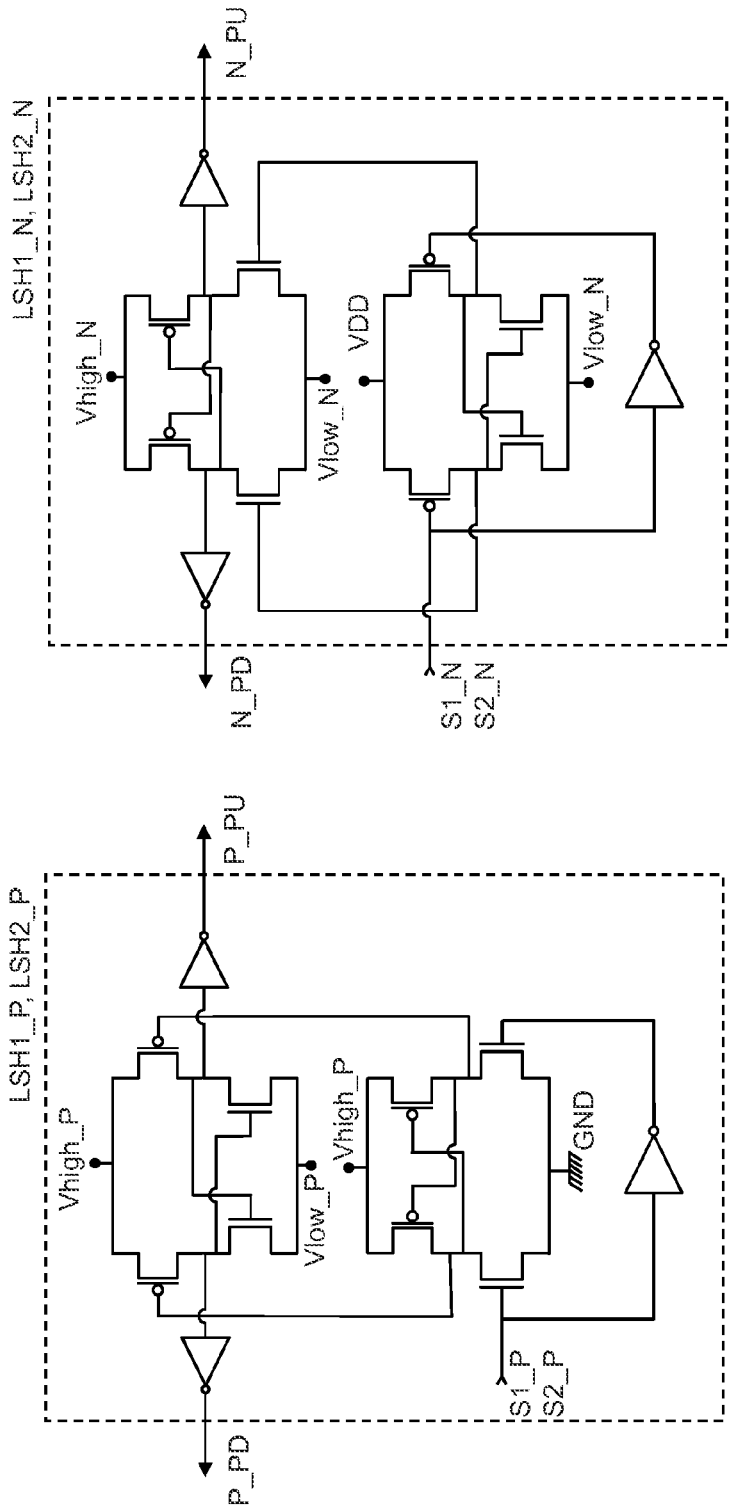
FIG. 7 represents a level translator circuit for transposing the logic signals to a higher voltage band.
FIG. 8 represents a level translator circuit for transposing the logic signals to a lower voltage band.

FIG. 7 represents the configuration of a level translator LSH1_P which can be used for a translation to higher potentials. It receives the pulse S1_P and supplies a pulse P_PU on one of its outputs; the pulse P_PU is a pulse for incrementing the voltage PBIAS and this should be, as will be seen, a transition pulse to the low logic level because it controls a PMOS transistor. The circuit LSH1_P has a second output referenced P_PD, the logical complement of the first, but which is not used. The level translator LSH2_P is strictly identical but it receives the pulse S2_P and it uses the second output P_PD and not the first; in fact, it has to produce a PBIAS voltage decrementation pulse and this pulse has to be a transition pulse to the high logical level because it controls an NMOS transistor.

In this diagram, Vhigh_P and Vlow_P have been used to designate voltage sources allowing for the transposition of the pulse levels to the voltage band from Vlow_P to Vhigh_P. The zero reference potential is used in this diagram. Vlow_P is, in principle, equal to Varray; Vhigh_P may be equal to Varray+ 0.9 volt.

Similarly, FIG. 8 represents a level translator LSH1_N for a translation to lower potentials. It receives the pulse S1_N and supplies a pulse N_PU on one of its outputs (transition pulse to the low level for the control of a PMOS transistor for incrementing NBIAS); it has a complementary logic output N_PD which is not used. The translator LSH2_N is identical. It receives the pulse S2_N and it supplies a pulse on the second output N_PD and not the first (transition pulse to the high level for the control of an NMOS transistor for decrementing NBIAS). These two level translators are powered by voltages Vhigh_N and Vlow_N and by the potential VDD used in the preceding stages. Vhigh_N is, in principle, equal to 0; Vlow_N may be equal to −0.9 volt.

FIG. 9 represents another example of a level translator circuit, which can be used equally for an upward level translation and for a downward level translation.

Finally, FIG. 10 represents the two output integrator stages BFP and BFN supplying the voltages PBIAS and NBIAS. These are stages that each comprise an NMOS transistor in series with a PMOS transistor. These series assemblies are powered by the potentials Vhigh_P and Vlow_P for the stage supplying the PBIAS potential (FIG. 10A) or by the potentials Vhigh_N and Vlow_N for the stage supplying the NBIAS potential (FIG. 10B).

The pulses from the outputs P_PU and P_PD of the level translators are applied respectively to the gate of the PMOS transistor and to the gate of the NMOS transistor for the stage which supplies the bias voltage PBIAS. The logic levels N_PU and N_PD are applied to the gates of the transistors of the stage which supplies the bias voltage PBIAS.

The pulse P_PU (PBIAS incrementation) is a zero transition pulse (Vlow_P) and briefly makes the PMOS transistor conduct.

The pulse P_PD (PBIAS decrementation) is a high level transition pulse (Vhigh_P) and briefly makes the NMOS transistor conduct.

The pulse N_PU (NBIAS incrementation) is a high level transition pulse (Vhigh_N) and briefly makes the PMOS transistor conduct.

The pulse N_PD (NBIAS decrementation) is a low level transition pulse (Vlow_N) and briefly makes the NMOS transistor conduct.

The invention claimed is:

1. A bias circuit for inverters of an integrated circuit, each inverter comprising an NMOS transistor and a PMOS transistor powered by a power supply voltage Varray, with means for applying a first rear bias voltage NBIAS to wells of the NMOS transistors and a second rear bias voltage PBIAS to wells of the PMOS transistors, the bias circuit supplying the bias voltages and comprising:
 a detection array comprising a set of many inverters mounted in parallel, the inverters of said set being biased by the two bias voltages and receiving on their gates a common reference voltage between 0 and a power supply voltage Varray of the inverters, the common output of the inverters of said set forming an output of the detection array, said output providing a logic signal whose value depends on the rear bias voltages applied to the array,
 a circuit for producing incrementation or decrementation pulses, controlled by the output of the detection array, and
 an integration circuit linked to the pulse-producing circuit, to produce and vary, progressively by increments in response to the pulses, a bias voltage PBIAS and a bias voltage NBIAS in a direction tending to invert the output logic signal of the detector array.

2. The bias circuit according to claim 1, wherein the voltage applied to the gates of the transistors of the inverters of the detection array is Varray/2.

3. The bias circuit according to claim 1, wherein a logic level translation circuit is interposed between the output of the detection array and an input of the pulse-producing circuit.

4. The bias circuit according to claim 1, wherein the pulse-producing circuit comprises a detection amplifier and a control circuit, the control circuit comprising a clock circuit periodically producing an activation signal made up of brief pulses which are detection amplifier activation pulses, the detection amplifier receiving a voltage from the detection array and acting as a comparator relative to a reference voltage to produce, on one of two outputs, according to the result of the comparison, a control pulse.

5. The bias circuit according to claim 4, wherein the control circuit receives the two outputs of the detection amplifier and produces four corresponding pulsed logic signals, according to the results of the comparison, transmitted respectively to four level translator circuits, among which two first level translator circuits converting two of the signals into a voltage band corresponding to a voltage variation band desired for the bias voltage PBIAS, and two other level translator circuits converting the other two signals into a voltage band corresponding to a voltage variation band desired for the bias voltage NBIAS.

6. The bias circuit according to claim 5, wherein the integration circuit comprises a first circuit for producing the bias voltage PBIAS and a second circuit for producing the bias voltage NBIAS, the first circuit having inputs for receiving outputs of two first level translator circuits, and the second circuit having inputs for receiving outputs of the other two level translator circuits.

7. The bias circuit according to claim 6, wherein the first and the second circuits each comprise a PMOS transistor in series with an NMOS transistor, supplying the voltage PBIAS or respectively the voltage NBIAS at the junction point of the two transistors, the outputs of the level translator circuits being applied to the gates of the transistors, the set of series transistors of the first circuit being powered between a low voltage and a high voltage corresponding to a desired voltage band for the variation of the voltage PBIAS, and the set of series transistors of the second circuit being powered between a low voltage and a high voltage corresponding to a desired voltage band for the variation of the voltage NBIAS.

8. The bias circuit according to claim 1, wherein the circuit supplies rear bias voltages PBIAS and NBIAS to the PMOS and NMOS transistors of the inverters of an SRAM memory.

9. The bias circuit according to claim 8, further comprising an enable input which enables or disables the application of incrementation or decrementation pulses to the integration circuit, notably to enable this application in standby mode with reduced voltage power supply for the memory.

10. The bias circuit according to claim 1, comprising means for applying, to the inverters in standby mode, a reduced power supply voltage Varray compared to a general power supply voltage of the integrated circuit.

11. The bias circuit according to claim 1, wherein the circuit is integrated in a circuit comprising an SRAM memory consisting of a matrix of binary storage elements, each storage element comprising at least two inverters identical to the inverters of the detection array.

12. The bias circuit according to claim 2, wherein a logic level translation circuit is interposed between the output of the detection array and an input of the pulse-producing circuit.

13. The bias circuit according to claim 2, wherein the pulse-producing circuit comprises a detection amplifier and a control circuit, the control circuit comprising a clock circuit periodically producing an activation signal made up of brief pulses which are detection amplifier activation pulses, the detection amplifier receiving a voltage from the detection array and acting as a comparator relative to a reference voltage to produce, on one of two outputs, according to the result of the comparison, a control pulse.

14. The bias circuit according to claim 13, wherein the control circuit receives the two outputs of the detection amplifier and produces four corresponding pulsed logic signals, according to the results of the comparison, transmitted respectively to four level translator circuits, among which two first level translator circuits converting two of the signals into a voltage band corresponding to a voltage variation band desired for the bias voltage PBIAS, and two other level translator circuits converting the other two signals into a voltage band corresponding to a voltage variation band desired for the bias voltage NBIAS.

15. The bias circuit according to claim 2, wherein the circuit supplies rear bias voltages PBIAS and NBIAS to the PMOS and NMOS transistors of the inverters of an SRAM memory.

16. The bias circuit according to claim 3, wherein the circuit supplies rear bias voltages PBIAS and NBIAS to the PMOS and NMOS transistors of the inverters of an SRAM memory.

* * * * *